United States Patent
Ceballos et al.

(10) Patent No.: US 12,077,860 B2
(45) Date of Patent: Sep. 3, 2024

(54) DOPED AMORPHOUS OPTICAL DEVICE FILMS AND DEPOSITION VIA INCORPORATION OF DOPANT ATOMS

(71) Applicant: Applied Materials, Inc., Santa Clara, CA (US)

(72) Inventors: Andrew Ceballos, Santa Clara, CA (US); Ludovic Godet, Sunnyvale, CA (US); Karl J. Armstrong, Sunnyvale, CA (US); Rami Hourani, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 513 days.

(21) Appl. No.: 17/366,832

(22) Filed: Jul. 2, 2021

(65) Prior Publication Data
US 2022/0025518 A1      Jan. 27, 2022

Related U.S. Application Data

(60) Provisional application No. 63/055,158, filed on Jul. 22, 2020.

(51) Int. Cl.
| | |
|---|---|
| G02B 1/10 | (2015.01) |
| C23C 16/455 | (2006.01) |
| C23C 16/56 | (2006.01) |

(52) U.S. Cl.
CPC ........ *C23C 16/45563* (2013.01); *C23C 16/56* (2013.01); *G02B 1/10* (2013.01)

(58) Field of Classification Search
CPC ..... G02B 1/10; C23C 16/45563; C23C 16/56; C23C 14/0057; C23C 14/083; C23C 14/14; C23C 14/3464
See application file for complete search history.

(56) References Cited

U.S. PATENT DOCUMENTS

| | | | |
|---|---|---|---|
| 2006/0255739 A1* | 11/2006 | Ritz | C23C 14/08 313/635 |
| 2010/0102450 A1* | 4/2010 | Narayan | C23C 14/28 427/126.6 |

(Continued)

FOREIGN PATENT DOCUMENTS

| | | |
|---|---|---|
| CN | 1741972 A | 3/2006 |
| CN | 108690968 A | 10/2018 |

(Continued)

OTHER PUBLICATIONS

PCT Notification of Transmittal of the International Search Report and the Written Opinion of the International Searching Authority for International Application No. PCT/US2021/039790; dated Oct. 20, 2021.

(Continued)

*Primary Examiner* — Mustak Choudhury
(74) *Attorney, Agent, or Firm* — Patterson + Sheridan, LLP

(57) ABSTRACT

Embodiments of the present disclosure generally relate to methods and materials for optical device fabrication. More specifically, embodiments described herein provide for optical film deposition methods and materials to expand the process window for amorphous optical film deposition via incorporation of dopant atoms by suppressing the crystal growth of optical materials during deposition. By enabling amorphous films to be deposited at higher temperatures, significant cost savings and increased throughput are possible.

17 Claims, 6 Drawing Sheets

(56) References Cited

U.S. PATENT DOCUMENTS

2018/0277365 A1* 9/2018 Burst ................. H01L 21/0257
2018/0286679 A1  10/2018 Houben et al.

FOREIGN PATENT DOCUMENTS

| CN | 110199376 A | 9/2019 | |
|----|---|---|---|
| KR | 2009-0070286 A | 7/2009 | |
| KR | 2020-0025030 A | 3/2020 | |
| TW | 201609383 A | 3/2016 | |
| WO | WO-2018102852 A1 * | 6/2018 | ............. C23C 14/14 |

OTHER PUBLICATIONS

Taiwan Application No. 110125119, Office Action dated Nov. 2, 2023, 20 pages.
Taiwan Application No. 110125119, Office Action dated May 9, 2024, 6 pages.

* cited by examiner

DOPED AMORPHOUS OPTICAL DEVICE FILMS AND DEPOSITION VIA INCORPORATION OF DOPANT ATOMS

CROSS-REFERENCE TO RELATED APPLICATIONS

This application claims the benefit of U.S. Patent Application No. 63/055,158, filed on Jul. 22, 2020, the contents of which are herein incorporated by reference.

BACKGROUND

Field

Embodiments of the present disclosure generally relate to optical device fabrication. More specifically, embodiments described herein provide for doped optical device films, optical devices having doped structures, and methods of forming doped optical device films and structures.

Description of the Related Art

Optical devices, such as waveguides, flat optical devices, metasurfaces, color-filters, and anti-reflective coatings, are engineered to exhibit a high refractive index and low absorption loss properties. Conducting materials have a high refractive index and low absorption loss that enable fabrication of efficient, large-scale optical devices.

Optical devices having polycrystalline films are inhomogeneous, have large surface roughness, and may be birefringent, while amorphous films are homogeneous, smooth, and have a uniform refractive index. However, conventional physical vapor deposition (PVD) processes to form amorphous films for optical devices are performed at a substrate temperature of less than 30° C. in order to inhibit crystallite formation. The processing temperature for titanium dioxide of less than 30° C. increases fabrication cost and complexity due to the need for specialized hardware, while a processing temperature over about 30° C. results in polycrystalline titanium dioxide films with a significant amount of inhomogeneity. Further, processing temperatures at about 200° C. or greater results in pronounced crystals in the film.

Accordingly, what is needed in the art are improved doped optical device films, optical devices having doped structures, and methods of forming doped optical device films and structures.

SUMMARY

In one embodiment, a method is provided. The method includes disposing an optical device substrate on a substrate support. The substrate support is disposed in a chamber. The chamber includes an optical device material target disposed in the chamber and a dielectric target disposed in the chamber. The optical device material target includes an optical device material and the dielectric target includes a dopant material. A doped optical device film is deposited on the optical device substrate. The depositing the doped optical device film includes depositing the optical device material to form an optical device layer on a surface of the optical device substrate and depositing the dopant material into the optical device layer to form the doped optical device film. The depositing the optical device material includes providing a first power level to the optical device material target to deposit the optical device layer at a first deposition rate. The depositing the dopant material into the optical device layer includes providing a second power level to the dielectric target to deposit the dielectric target at a second deposition rate. The first deposition rate and the second deposition rate are different.

In another embodiment, a method is provided. The method includes disposing an optical device substrate in a chamber including a target having a pre-doped optical device material. The pre-doped optical device material includes an optical device material at a first concentration and a dopant material at a second concentration. Power is provided to the target to deposit a doped amorphous optical device layer on the optical device substrate.

In another embodiment, a method is provided. The method includes disposing an optical device substrate on a substrate support. The substrate support is disposed in a chamber. The chamber includes an optical device material target disposed in the chamber and a dielectric target disposed in the chamber. The optical device material target includes a metal material and the dielectric target includes a dopant material. A doped optical device film is deposited on the optical device substrate. The depositing the doped optical device film includes depositing the optical device material to form an optical device layer on a surface of the optical device substrate and depositing the dopant material into the optical device layer to form the doped optical device film. The depositing the optical device material includes providing a first power level to the optical device material target and providing an oxygen-containing gas to the chamber to deposit the optical device layer at a first deposition rate. The depositing the dopant material into the optical device layer includes providing a second power level to the dielectric target to deposit the dielectric target at a second deposition rate. The first deposition rate and the second deposition rate are different.

In yet another embodiment, an optical device is provided. The optical device includes an amorphous optical device layer disposed over a surface of an optical device substrate. The amorphous optical device layer includes an amorphous optical device material and a dopant material, wherein the dopant material is incorporated into the amorphous optical device material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
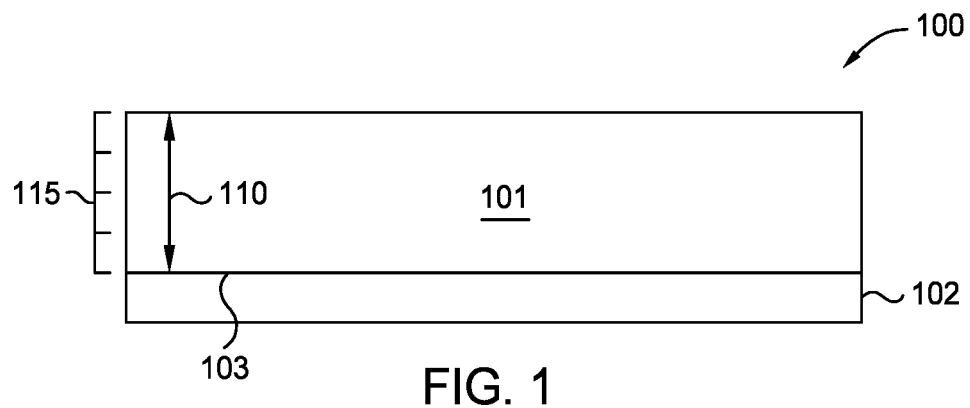
FIG. 1 is a cross-sectional view of an optical device including a doped optical device film disposed on an optical device substrate according to embodiments.

Embodiments described herein relate to optical device fabrication. Specifically, embodiments described herein provide for doped optical device films, optical devices having doped structures, and methods of forming doped optical device films and structures. Embodiments described herein provide for doped optical device films and structures having an optical device layer with an optical device material concentration of an optical device material and a dopant material with a dopant concentration throughout the thickness of the doped optical device films and structures.

The optical device material, described and referenced to herein, has an optical device material refractive index of about 2.0 or greater. The dopant material, described and referenced to herein, has a dopant refractive index of less than 2.0. In combination, the optical device material and the dopant material distributed uniformly throughout make up the doped optical device film having an optical device refractive index of about 2.0 or greater. The optical device layer is formed when the optical device material is oxidized, nitrated, or oxy-nitrated and is deposited or flowed over the optical device substrate. In one embodiment, which can be combined with other embodiments described herein, the optical device material includes a uniform distribution of the dopant material.

In one embodiment, which can be combined with other embodiments described herein, the optical device material is a metal-containing material. The metal-containing material includes, but is not limited to metals, metal oxides, metal nitrides or metal oxy-nitrides. In another embodiment, which can be combined with other embodiments described herein, the optical device material is a semiconductor material. The semiconductor material includes but is not limited to, silicon (Si), germanium (Ge), silicon germanium (SiGe), III-V semiconductors, II-IV semiconductors, ternary semiconductors, quaternary semiconductors, transparent conducting oxides, or combinations thereof. In other embodiments, the semiconductor material is an oxide, oxynitride, nitride, or carbide of Si, Ge, SiGe, a III-V semiconductor, a II-IV semiconductor, a ternary semiconductor, a quaternary semiconductor, or a transparent conducting oxide. The dopant material includes, but is not limited to, silicon (Si), aluminum (Al), niobium (Nb), titanium (Ti), tantalum (Ta), zirconium (Zr), indium (In), or hafnium (Hf), and oxides, nitrides, or oxynitrides thereof.

In one embodiment, a method includes disposing an optical device substrate on a substrate support disposed in a chamber. An optical device material is deposited to form an optical device layer over the surface of the optical device substrate. The depositing the optical device material includes providing a first power level to an optical device material target to deposit the optical device material at a first deposition rate. A dopant material is deposited uniformly into the optical device layer to form the doped optical device film. The depositing the dopant material includes providing a second power level to the dielectric target to deposit the dopant material at a second deposition rate.

FIG. 1 is a cross-sectional view of an optical device 100. A doped optical device film 101 is disposed over a surface 103 of an optical device substrate 102 according to embodiments described herein. The doped optical device film 101 is formed by the methods 600, 700, 800, and 900 described herein. The optical device substrate 102 is any suitable optical device substrate on which an optical device may be formed. In one embodiment, the optical device substrate 102 includes, but is not limited to, silicon (Si), silicon nitride (SiN), silicon dioxide ($SiO_2$), fused silica, quartz, silicon carbide (SiC), germanium (Ge), silicon germanium (SiGe), indium phosphide (InP), gallium arsenide (GaAs), gallium oxide (GaO), diamond, lithium niobate ($LiNbO_3$), gallium nitride (GaN), sapphire, tantalum oxide ($Ta_2O_5$), titanium dioxide ($TiO_2$), or combinations thereof. The optical device substrate 102 may include a perovskite material that is optically transparent.

The doped optical device film 101 includes an optical device layer, which includes an optical device material. The doped optical device film 101 also includes a dopant material distributed within the optical device layer. The doped optical device film 101 is amorphous in order to achieve optical properties, including a uniform refractive index greater than about 2.0 and low absorption loss. The optical device layer is formed when the optical device material is oxidized, nitrated, or oxy-nitrated and is deposited or flowed over the optical device substrate 102. Examples of doped optical device films 101 that may be formed from the reaction of the optical device material and the dopant material include but are not limited to, tantalum pentoxide ($Ta_2O_5$), zirconium dioxide ($ZrO_2$), indium oxide ($In_2O_3$), or hafnium oxide ($HfO_2$).

The doped optical device film 101 has a thickness 110. The thickness 110 is divided into a range of zones 115. In one embodiment, which can be combined with other embodiments described herein, the thickness 110 has a uniform or substantially uniform distribution of dopant material throughout the range of zones 115. In one embodiment, the doped optical device film 101 includes an optical device refractive index greater than about 2.0 that is uniform throughout the thickness 110. In another embodiment, the doped optical device film 101 includes an optical device refractive index of about 2.6 to about 2.7 that is uniform throughout the thickness 110.

The dopant material, described and referenced to herein, has a dopant refractive index of less than 2.0. In combination, the optical device material making up the optical device layer and the dopant material distributed throughout, make up the doped optical device film 101 having an optical device refractive index of about 2.0 or greater.

The doped optical device film 101 includes the optical device material at an optical device material concentration and the dopant material at a dopant material concentration. The optical device material includes one or both of a metal-containing material and a semiconductor material.

The tuning of the optical device material concentration, optical device material refractive index, dopant material concentration, and dopant material refractive index will determine the optical properties of the optical device film 101, such as the optical device refractive index.

In one embodiment, which can be combined with other embodiments described herein, the doped optical device film 101 includes the optical device material concentration of about 85% to about 100% atomic percentage. In another embodiment, which can be combined with other embodiments described herein, the doped optical device film 101 includes the dopant material at the dopant concentration from about 0% to 15% atomic percentage. A dopant concentration of about 0 to about 50% affects the morphology of the doped optical device film 101 without a significant detrimental increase in the refractive index of the optical device layer.

To achieve desirable optical properties, the dopant material may be distributed in the optical device layer and maintained within a temperature process window. In some embodiments, the dopant material is uniformly distributed in the optical device layer. The temperature process window is a range of temperatures at which the optical device layer forms amorphously in order to achieve optical properties, including a uniform high refractive index and low absorption loss. Without a dopant material, the optical device layer forms amorphously within a certain temperature process window and forms crystalline structures when the optical device layer exceeds the temperature process window. An optical device layer without a dopant material forms amorphously within a temperature process window of less than 30° C. and becomes crystalline at temperatures above 30° C. A dopant material uniformly incorporated into the optical device layer inhibits the growth of crystalline structures and expands the temperature process window of the formed doped optical device films 101 as described in methods 600, 700, 800, and 900. An optical device layer with a dopant material uniformly incorporated at a dopant concentration (e.g., 5% atomic percentage) into the optical device layer expands the temperature process window at which the doped optical device film 101 forms amorphously to temperatures greater than about 30° C., for example a temperature process window between about 30° C. and 300° C.

Figure 2A:
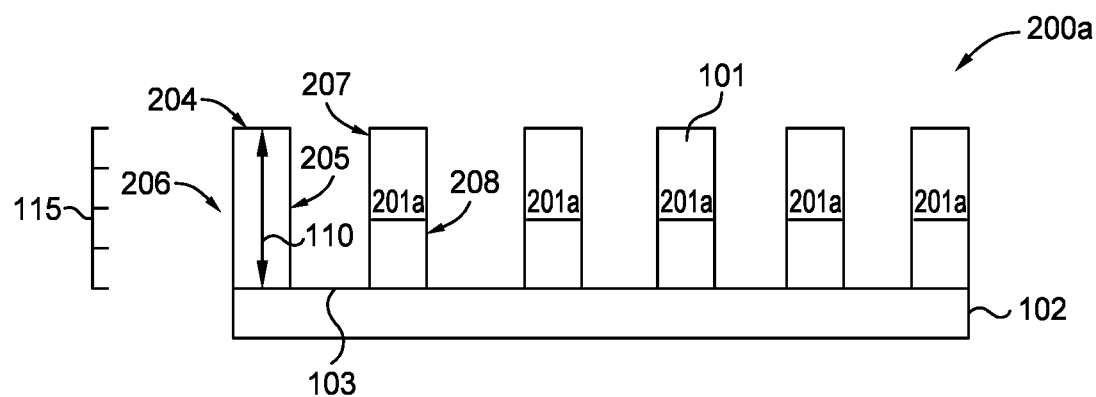
FIG. 2A is a schematic cross-sectional view of binary optical device structures disposed on an optical device substrate according to embodiments.
Figure 2B:
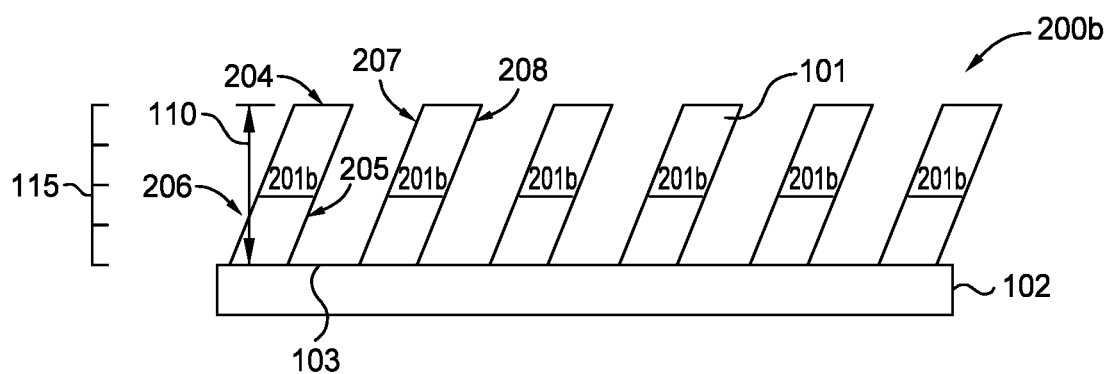
FIG. 2B is a schematic cross-sectional view of angled optical device structures disposed on an optical device substrate according to embodiments.

FIG. 2A is a schematic, cross-sectional view of binary optical device structures 201a disposed on an optical device substrate 102. FIG. 2B is a schematic, cross-sectional view of angled optical device structures 201b disposed on an optical device substrate 102. An optical device 200a, 200b includes the optical device structures 201a, 201b disposed on a surface 103 of an optical device substrate 102. The optical device structures 201a, 201b may be formed, for example, by etching the doped optical device film 101 formed by the methods 600, 700, 800, and 900 described herein.

As shown in FIG. 2A, the optical device structures 201a are binary (i.e., vertical) structures. The optical device structures 201a, as shown in FIG. 2A, include a top surface 204 parallel to the surface 103 of the optical device substrate 102. A first sidewall 205 and a second sidewall 206 are parallel to a third sidewall 207 and a fourth sidewall 208. The sidewalls 205, 206, 207, and 208 are oriented normal to a major axis of the optical device substrate 102.

As shown in FIG. 2B, the optical device structures 201b are angled structures. The optical device structures 201b, as shown in FIG. 2B, include the first sidewall 205 and second sidewall 206 parallel to third sidewall 207 and fourth sidewall 208. The sidewalls 205, 206, 207, and 208 are slanted relative to the surface 103 of the optical device substrate 102.

The optical device structures 201a, 201b formed from the optical device film 101 include an optical device material concentration of the optical device material and the dopant material concentration of the dopant material distributed throughout a thickness 110 of the optical device film 101. The distribution of the dopant material throughout the thickness 110 provides for a uniform refractive index greater than about 2.0 and low absorption loss.

Figure 3:
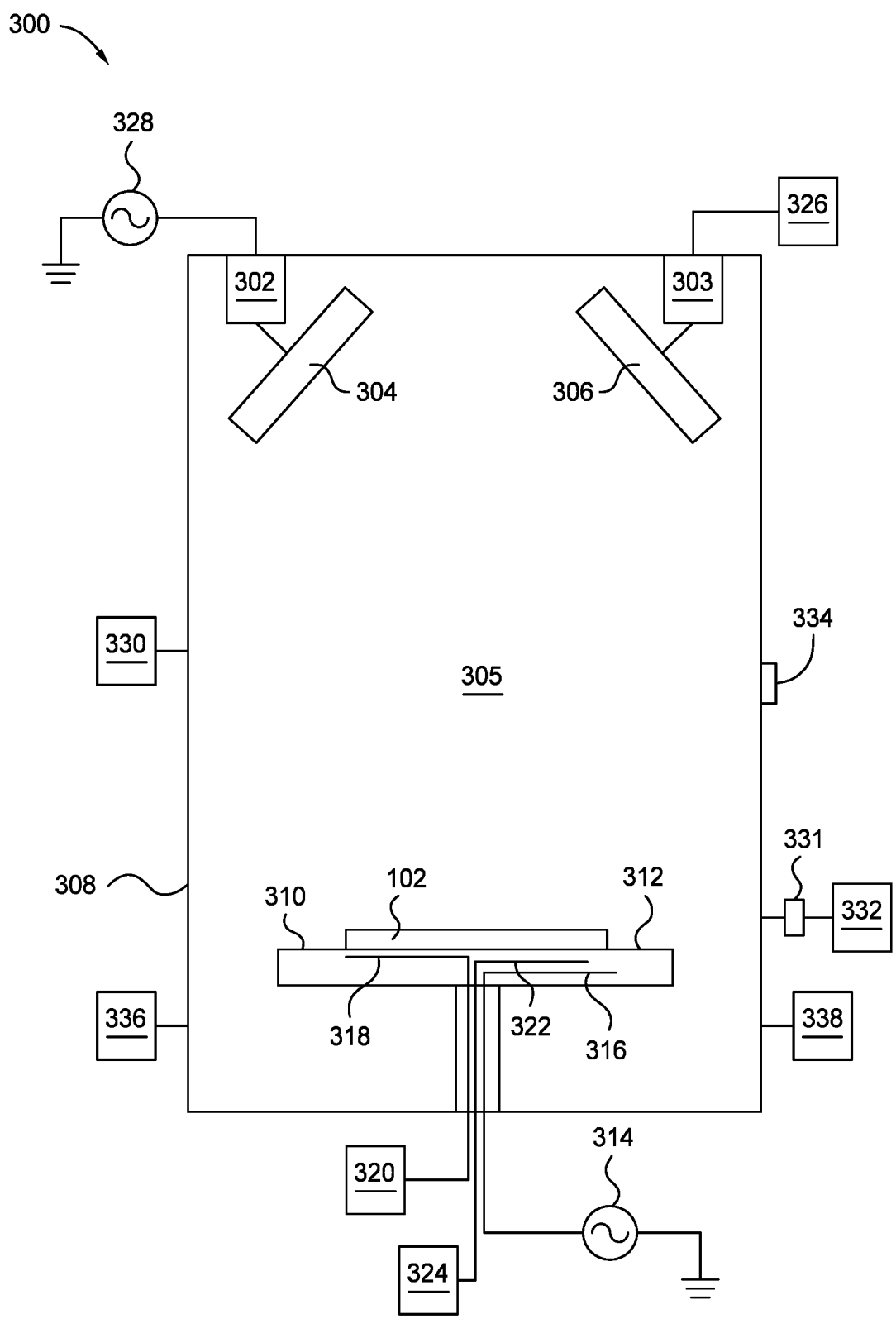
FIG. 3 is a schematic cross sectional view of a physical vapor deposition (PVD) process chamber according to embodiments.

FIG. 3 is a schematic cross-sectional view of a PVD chamber 300. It is to be understood that the PVD chamber 300 described below is an exemplary PVD chamber and other PVD chambers, including PVD chambers from other manufacturers, may be used with or modified to accomplish aspects of the present disclosure. The PVD chamber 300 can be used for the methods 600, 700, 800, and 900 described herein.

The PVD chamber 300 is utilized to form the doped optical device film 101. The PVD chamber 300 includes a plurality of cathodes including at least one dielectric target cathode 302 and at least one optical device material target cathode 303 having a corresponding plurality of targets including at least one dielectric target 304 and at least one optical device material (e.g., metallic or semiconductor) target 306, attached to the chamber body 308. While FIG. 3 depicts one dielectric target 304 and one optical device material target 306, the PVD chamber 300 may include one or more dielectric targets 304 and/or one or more optical device material targets 306. For example, 3-5 targets selected from at least one of the dielectric targets 304 or the optical device material targets 306 may be included in the PVD chamber 300. In embodiments with the one or more dielectric targets 304 and the one or more optical device material targets 306, each dielectric target 304 is operable to deposit a different dopant material and/or each optical device material target 306 is operable to deposit a different optical device material.

The PVD chamber 300 is configured to include a substrate support 310 having a support surface 312 to support an optical device substrate 102. The PVD chamber 300 includes an opening 334 (e.g., a slit valve) through which the optical device substrate may enter a process volume 305.

In the embodiment shown in FIG. 3, the substrate support 310 includes an RF bias power source 314 coupled to a bias electrode 316 disposed in the substrate support 310. The PVD chamber 300 includes a sputter gas source 336 that provides a sputter gas, such as argon (Ar). The PVD chamber 300 includes a reactive gas source 338 that provides a reactive gas, such as an oxygen-containing gas or a nitrogen-containing gas.

The substrate support 310 includes a mechanism (not shown) that retains the optical device substrate 102 on a support surface 312 of the substrate support 310, such as an electrostatic chuck, a vacuum chuck, a substrate retaining clamp, or the like. The substrate support 310 is configured to include a cooling conduit 318 disposed in the substrate support 310 where the cooling conduit 318 controllably cools the substrate support 310 and the optical device substrate 102 positioned thereon to a predetermined temperature, for example between about 30° C. to about 300° C. The cooling conduit 318 is coupled to a cooling fluid source 320 to provide cooling fluid. The substrate support 310 is further configured to include a heater 322 embedded therein. The heater 322, such as a resistive element, disposed in the substrate support 310 is coupled to an optional heater power source 324 and controllably heats the substrate support 310 and the optical device substrate 102 positioned thereon to a predetermined temperature, for example between about 30° C. to 300° C. Each target (e.g., dielectric target 304 or optical device material target 306) has a DC power source 326 or an RF power source 328 and an associated magnetron. The multiple power sources enable both DC powered processes and RF powered processes to occur in the same PVD chamber 300.

The PVD chamber 300 includes a process gas supply 330 to supply a predetermined process gas to the process volume 305 of the PVD chamber 300. For example, the process gas supply 330 supplies oxygen-containing gas to the process volume 305 to form an oxidizing environment in the process volume 305. The PVD chamber 300 may also include a precursor gas source 332 to supply a precursor gas, for example a gaseous dopant precursor, which is controlled by precursor gas flow controller 331.

Figure 4:
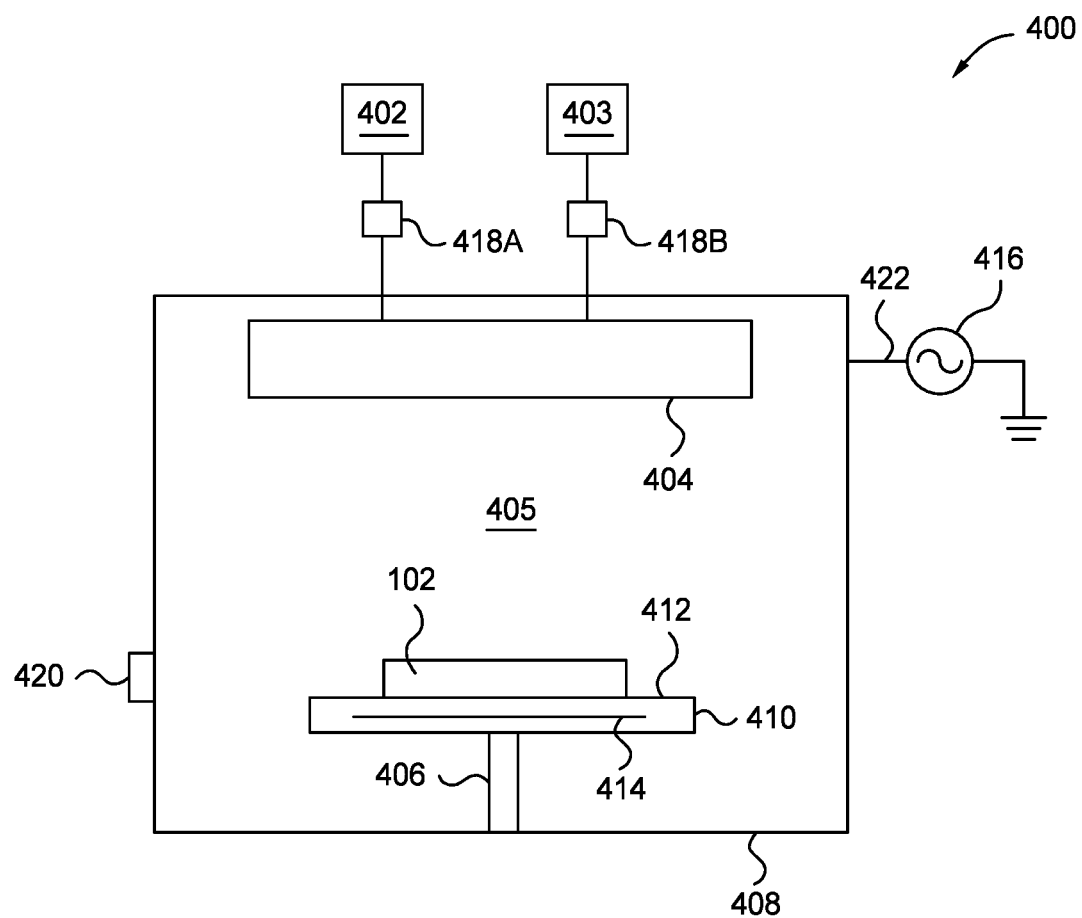
FIG. 4 is a schematic cross sectional view of a chemical vapor deposition (CVD) process chamber according to embodiments.

FIG. 4 is a schematic cross-sectional view of a CVD chamber 400. It is to be understood that the CVD chamber 400 described below is an exemplary CVD chamber and other CVD chambers, including CVD chambers from other manufacturers, may be used with or modified to accomplish aspects of the present disclosure.

The CVD chamber 400 has a chamber body 408 that includes a processing volume 405 having a substrate support 410 disposed therein to support an optical device substrate 102 thereon. The substrate support 410 includes a heating/cooling conduit 414 and a mechanism that retains the optical device substrate 102 on a support surface 412 of the substrate support 410, such as an electrostatic chuck, a vacuum chuck, a substrate retaining clamp, or the like. The substrate support 410 is coupled to and movably disposed in the processing volume 405 by a stem 406 connected to a lift system (not shown) that moves the substrate support 410 between an elevated processing position and a lowered position that facilitates transfer of the optical device substrate 102 to and from the CVD chamber 400 through an opening 420.

The CVD chamber 400 includes flow controllers 418a, 418b such as a mass flow control (MFC) device, disposed between a first gas source 402, a second gas source 403, and the chamber body 408 to control the flow rates of process gasses from the first gas source 402 and the second gas source 403 to a showerhead 404 used for distributing the process gasses across the processing volume 405. The first gas source 402 is operable to include an optical device material. The second gas source 403 is operable to include a dopant material. While FIG. 4 depicts two gas sources 402, 403, the CVD chamber 400 may include one or more first gas sources 402 and/or one or more second gas sources 403. For example, 3-5 gas sources selected from at least one of the first gas sources 402 or the second gas sources 403 may be included in the chamber 300. In embodiments with the one or more first gas sources 402 and the one or more second gas sources 403, each first gas source 402 is operable to deposit a different optical device material and/or each second gas source 403 is operable to deposit a different dopant material.

The showerhead 404 is connected to a RF power source 416 by an RF feed 422 for generating a plasma in the processing volume 405 from the process gasses. The RF power source 416 provides RF energy to the showerhead 404 to facilitate generation of a plasma between the showerhead 404 and the substrate support 410. The stem 406 is configured to move the substrate support 410 to an elevated processing position.

Figure 5:
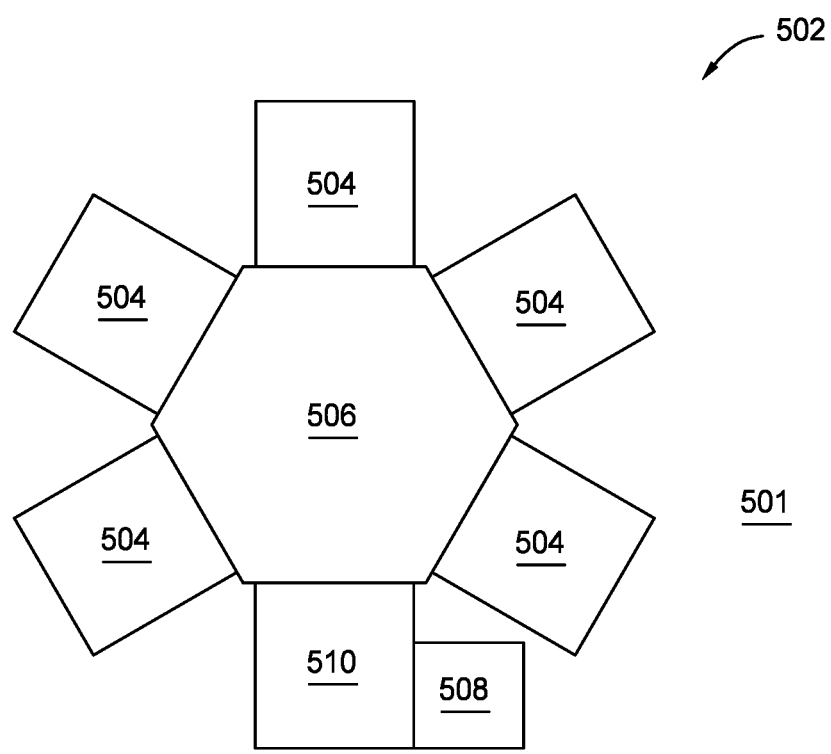
FIG. 5 is a schematic top view of a cluster tool according to embodiments.

FIG. 5 is a schematic view of a cluster tool 502 in a factory environment 501. It is to be understood that the cluster tool 502 described herein is an exemplary cluster and that other cluster tools may be used with or modified to accomplish aspects of the present disclosure. The cluster tool 602 described herein may be utilized for methods 700, 800, 900, and 1000 described herein.

The cluster tool 502 includes a transfer chamber 506 surrounded by one or more processing chambers 504. The processing chambers 504 may include any suitable type of processing chambers for forming doped optical device films 101 described herein. In one embodiment, which may be combined with other embodiments described herein, the processing chambers 504 may be PVD chambers 300. In another embodiment, which may be combined with other embodiments described herein, the processing chambers 504 may be CVD chambers 400. In yet another embodiment, which may be combined with other embodiments described herein, the processing chambers 504 may be a combination of PVD chambers 300 and CVD chambers 400.

Additionally, the cluster tool 502 includes a substrate access chamber 508 coupled to a load lock chamber 510. In one embodiment, the substrate access chamber 508 may be utilized to connect the factory environment 501, which is at atmospheric pressure, to the load lock chamber 510 which is under vacuum pressure. In one embodiment, which may be combined with other embodiments described herein, the cluster tool 502 may be utilized for a single chamber process such as wherein the processing chamber 504 is a PVD chamber 300 with at least two targets (e.g., dielectric target 304 or optical device material target 306). In another embodiment, which may be combined with other embodiments described herein, the cluster tool 502 may be utilized for a multi chamber process such as in methods 600-900, wherein the plurality of processing chambers 504 are PVD chambers 300, CVD chambers 400 or a combination of both. The cluster tool 502 will transfer the optical device substrate 102 between the plurality of processing chambers 504 such that optical device layers or dopant material can be deposited in each zone of the range of zones 115 in each processing chamber 504. The optical device substrate will enter each processing chamber 504 through openings 334, 420 of the PVD chambers 300 and CVD chambers 400, respectively.

Figure 6:
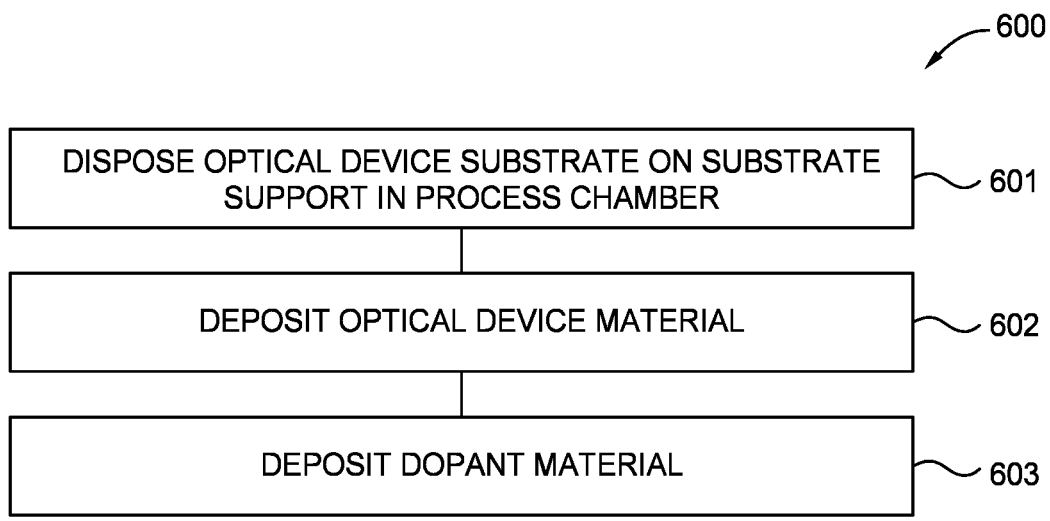
FIG. 6 is a flow diagram of a method for fabricating a doped optical device film according to embodiments.

FIG. 6 is a flow diagram of a method 600 for fabricating a doped optical device film 101. To facilitate explanation, FIG. 6 will be described with reference to the PVD chamber 300 of FIG. 3 and the cluster tool 502 of FIG. 5. However, it is to be noted that a PVD chamber other than the PVD chamber 300 of FIG. 3 may be utilized in conjunction with method 600. It is also to be noted that a cluster tool other than the cluster tool 502 of FIG. 5 may be utilized in conjunction with method 600. The cluster tool 502, as described above, may be utilized where the processing chambers 504 are PVD chambers 300. The method 600 deposits an optical device material onto an optical device substrate 102 to form an optical device layer. In one embodiment, which can be combined with other embodiments described herein, a dopant material may be deposited uniformly throughout the thickness 110 of the optical device layer.

At operation 601, an optical device substrate 102 intended for coating is disposed on a substrate support in a PVD chamber 300. For example, the optical device substrate 102 is disposed on the substrate support 310.

At operation 602, an optical device material is deposited. The optical device material is deposited from one or more optical device material targets 306 to form an optical device layer over the optical device substrate 102. The optical device material is one or both of a metal-containing material and a semiconductor material. The optical device material is deposited via a PVD process. In one embodiment, which can be combined with other embodiments described herein, the PVD process is a sputtering process. In another embodiment, which can be combined with other embodiments described herein, the PVD process is an evaporation process.

In embodiments when the optical device material is a metal, the optical device layer is formed when the deposited metal of the one or more optical device material targets 306 reacts with a reactive gas to form the optical device layer over the optical device substrate 102. A reactive gas source 338 provides a reactive gas, such as an oxygen-containing gas or a nitrogen-containing gas. For example, a pure titanium optical device material is deposited and reacted with a reactive gas such as oxygen to form titanium dioxide ($TiO_2$). In embodiments when the optical device material is a metal oxide, metal nitride, or metal oxy-nitride, the optical device layer is formed when the optical device material is deposited over the optical device substrate 102. The optical device material target cathode 303 coupled to the one or more optical device material targets 306 is set to a first power level in order to deposit the optical device material at a first deposition rate. When the first power level is applied, the first power level may remain constant throughout operations 602 and 603. The PVD chamber 300 may include one or more optical device material targets 306. For example, 3-5 targets selected from at least one of the optical device material targets 306 may be included in the PVD chamber 300. In embodiments with the one or more optical device material targets 306, each optical device material target 306 is operable to deposit a different optical device material.

The first power level of the target cathode is in the range of about 0% to about 100%. For example, the first power level of the target cathode is about 80% and the corresponding first deposition rate is about 0.35 nm/s. In one embodiment, the optical device layer includes an optical device material concentration of about 85% to about 100% atomic percentage. In one embodiment, the optical device material includes a first refractive index. The first refractive index is greater than 2.0. For example, the first refractive index is between about 2.0 to about 2.8. In embodiments when the optical device material is a metal-containing material, the metal-containing material includes, but is not limited to, metals, metal oxides, metal nitrides or metal oxy-nitrides such as titanium dioxide ($TiO_2$), tantalum pentoxide ($Ta_2O_5$), zirconium dioxide ($ZrO_2$), indium oxide ($In_2O_3$), or hafnium oxide ($HfO_2$). In embodiments when the optical device material is a semiconductor material, the semiconductor material includes, but is not limited to, silicon (Si), germanium (Ge), silicon germanium (SiGe), III-V semiconductors, II-IV semiconductors, ternary semiconductors, quaternary semiconductors, transparent conducting oxides, or combinations thereof. In other embodiments, the semiconductor material is an oxide, oxynitride, nitride, or carbide of Si, Ge, SiGe, a III-V semiconductor, a II-IV semiconductor, a ternary semiconductor, a quaternary semiconductor, or a transparent conducting oxide.

At operation 603, a dopant material is deposited. The dopant material is deposited from the dielectric target 304 to form the doped optical device film 101 on the optical device substrate 102. In one embodiment, which can be combined with other embodiments described herein, the dopant material is deposited such that it is uniformly concentrated in the optical device layer to form one or more zones of a doped optical device film 101. A dielectric target cathode 302 coupled to the dielectric target 304 is set to a second power level in order to deposit the dopant material at a second deposition rate. The second power level of the dielectric target cathode 302 is in the range of between about 0% to about 100%. For example, the second power level of the dielectric target cathode 302 is about 80% and the second deposition rate is about 0.35 nm/s. In one embodiment, the doped optical device film 101 includes a dopant material at a dopant concentration from about 0% to 15% atomic percentage. The dopant material includes, but is not limited to, silicon (Si), aluminum (Al), niobium (Nb), titanium (Ti), tantalum (Ta), zirconium (Zr), indium (In), or hafnium (Hf), and oxides, nitrides, or oxynitrides thereof. The PVD chamber 300 may include one or more dielectric targets 304. For example, 3-5 targets selected from at least one of the dielectric targets 304 may be included in the PVD chamber 300. In embodiments with the one or more dielectric targets 304, each dielectric target 304 is operable to deposit a different dopant material.

In one embodiment, which may be combined with other embodiments described herein, operations 602 and 603 are repeated by intervals of sequentially applying the first power level to the optical device material target cathode 303 and intervals of applying the second power level to the dielectric target cathode 302. In another embodiment, the depositing the dopant material at the second power level is performed by pulsing the second power level at a set frequency while depositing the optical device material. In yet another embodiment, which may be combined with other embodiments described herein, the optical device material and the dopant material are concurrently deposited by applying the first power level and the second power level concurrently to the targets (e.g., dielectric target 304 or optical device material target 306) to form the doped optical device film 101.

In one embodiment, which may be combined with other embodiments described herein, a single performance of operations 602 and 603 forms all of the zones of the range of zones 115. In another embodiment, a single performance of operations 602 and 603 form a portion of the doped optical device film 101 wherein that portion may correspond to one or more zones of the range of zones 115. Each zone of the range of zones 115 may be every 20 nm to 25 nm of the thickness 110. Operations 602 and 603 are repeated until a predetermined thickness 110 is reached. In one embodiment, which may be combined with other embodiments described herein, operations 602 and 603 can be performed in a PVD chamber 300 with at least two targets (e.g., dielectric target 304 or optical device material target 306). In another embodiment, which may be combined with other embodiments described herein, operations 602 and 603 can be performed in multiple processing chambers 504 of a cluster tool 502. For example, the optical device substrate 102 is transferred between at least two processing chambers 504. At least one of the processing chambers 504 is a PVD chamber 300 that includes an optical device material target 306 and at least another of the processing chambers 504 is a PVD chamber 300 that includes a dielectric target 302.

Figure 7:
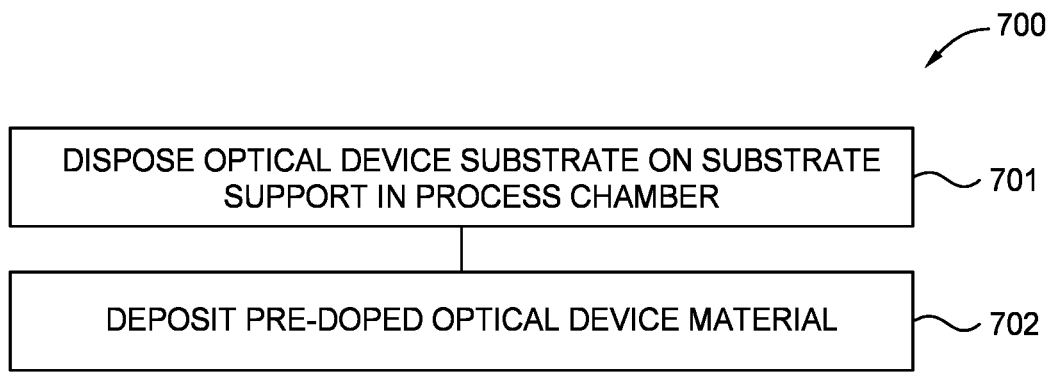
FIG. 7 is a flow diagram of a method for fabricating a doped optical device film according to embodiments.

FIG. 7 is a flow diagram of a method 700 for fabricating a doped optical device film 101. To facilitate explanation, FIG. 7 will be described with reference to the PVD chamber 300 of FIG. 3 and the cluster tool 502 of FIG. 5. However, it is to be noted that a PVD chamber other than the PVD chamber 300 of FIG. 3 may be utilized in conjunction with method 700. It is also to be noted that a cluster tool other than the cluster tool 502 of FIG. 5 may be utilized in conjunction with method 700. The cluster tool 502, as described above, may be utilized where the processing chambers 504 are PVD chambers 300.

At operation 701, an optical device substrate 102 intended for coating is disposed on a substrate support in a PVD chamber 300. For example, the optical device substrate 102 is disposed on the substrate support 310.

At operation 702, a pre-doped optical device material is deposited. The pre-doped optical device material is deposited from one or more optical device material targets 306 to form one or more zones 115 of a doped optical device film 101 over the optical device substrate 102. The pre-doped optical device material includes an optical device material and a dopant material. The pre-doped optical device material may include one or both of a metal-containing material or a semiconductor material. The metal-containing material includes, but is not limited to, metals, metal oxides, metal nitrides or metal oxy-nitrides such as titanium dioxide ($TiO_2$), tantalum pentoxide ($Ta_2O_5$), zirconium dioxide ($ZrO_2$), indium oxide ($In_2O_3$), or hafnium oxide ($HfO_2$). The semiconductor material includes, but is not limited to, silicon (Si), germanium (Ge), silicon germanium (SiGe), III-V semiconductors, II-IV semiconductors, ternary semiconductors, quaternary semiconductors, transparent conducting oxides, or combinations thereof. In other embodiments, the semiconductor material is an oxide, oxynitride, nitride, or carbide of Si, Ge, SiGe, a III-V semiconductor, a II-IV semiconductor, a ternary semiconductor, a quaternary semiconductor, or a transparent conducting oxide.

In embodiments where the pre-doped optical device material is a metal, the deposited metal reacts with a reactive gas to form one or more zones 115 of the doped optical device film 101 over the optical device substrate 102. The pre-doped optical device material further includes dopant material that includes, but is not limited to, silicon (Si), aluminum (Al), niobium (Nb), titanium (Ti), tantalum (Ta), zirconium (Zr), indium (In), or hafnium (Hf), and oxides, nitrides, or oxynitrides thereof. In one embodiment, which can be combined with other embodiments described herein, the dopant material is pre-doped uniformly throughout the pre-doped optical device material. The PVD chamber 300 may include one or more optical device material targets 306. For example, 3-5 targets selected from at least one of the optical device material targets 306 may be included in the PVD chamber 300. In embodiments with the one or more optical device material targets 306, each optical device material target 306 is operable to deposit a different pre-doped optical device material. In one embodiment, the pre-doped optical device material has a first refractive index. The first refractive index is greater than 2.0. For example, the first refractive index is between about 2.0 and about 2.8.

The optical device material target cathode 303 coupled to the optical device material target 306 is set to a first power level in order to deposit the pre-doped optical device material at a first deposition rate. When the first power level is applied, the first power level remains constant throughout operation 702. The pre-doped optical device material provided by the optical device material target 306 has a pre-determined concentration, the concentration of the pre-doped optical device material corresponding to the concentration of the doped optical device film 101. In one embodiment, which may be combined with other embodiments described herein, the pre-doped optical device material includes an optical device material concentration of about 85% to about 100% atomic percentage and a dopant material at a dopant material concentration from about 0% to 15% atomic percentage. For example, the pre-doped optical device material is a titanium dioxide ($TiO_2$) optical device material with a dopant material such as silicon dioxide ($SiO_2$) in the material at 5% atomic percentage. In one embodiment, the temperature of the deposition of the pre-doped optical device material is maintained at about 270° C. or less to prevent formation of crystal grains of titanium dioxide ($TiO_2$) in the doped optical device film 101.

In another embodiment, which may be combined with other embodiments described herein, a single application of operation 702 forms all of the zones of the range of zones 115. In another embodiment, repetitions of operation 702 form a portion of the doped optical device film 101, wherein that portion may correspond to one or more zones of the range of zones 115.

In yet another embodiment, which can be combined with other embodiments described herein, the one or more optical device material targets 306 are operable to deposit a pre-doped metal-containing material and a pre-doped semiconductor material. The pre-doped metal-containing material may be deposited simultaneously with the pre-doped semiconductor material to form the range of zones 115. The pre-doped metal-containing material and the pre-doped semiconductor material may be deposited individually from the same optical device material target 306 or from different optical device material targets 306.

In yet another embodiment, which can be combined with other embodiments described herein, the one or more optical device material targets 306 are operable to deposit the pre-doped metal-containing material from two or more of the optical device material targets 306 to form the range of zones 115. The pre-doped metal-containing material may be deposited individually from the same optical device material target 306 or from different optical device material targets 306.

Figure 8:
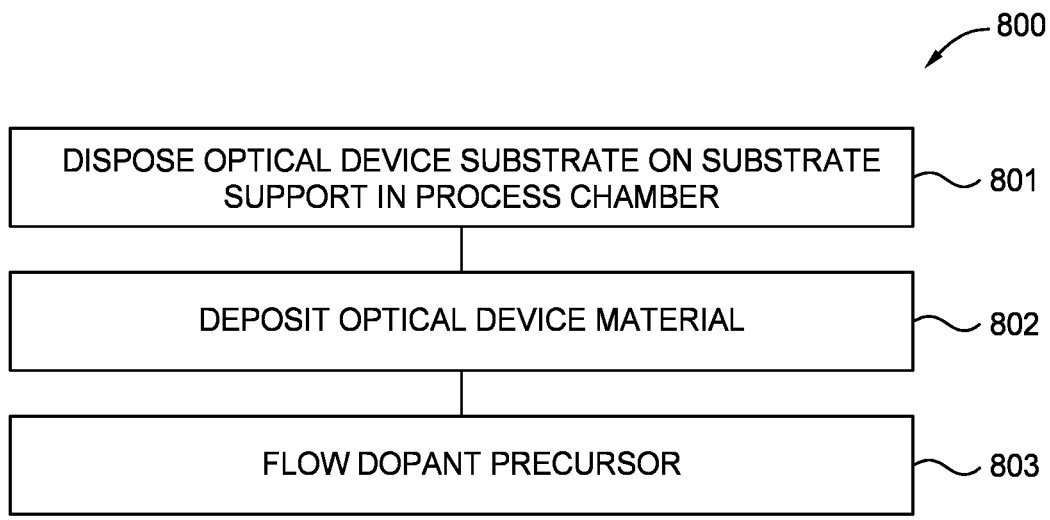
FIG. 8 is a flow diagram of a method for fabricating a doped optical device film according to embodiments.

FIG. 8 is a flow diagram of an exemplary method 800 for fabricating a doped optical device film 101. To facilitate explanation, FIG. 8 will be described with reference to the PVD chamber 300 of FIG. 3, the CVD chamber 400 of FIG. 4 and the cluster tool 502 of FIG. 5. However, it is to be noted that a PVD chamber other than the PVD chamber 300 of FIG. 3 may be utilized in conjunction with method 800. It is to be noted that a CVD chamber other than the CVD chamber 400 of FIG. 4 may be utilized in conjunction with method 800. It is also to be noted that a cluster tool other than the cluster tool 502 of FIG. 5 may be utilized in conjunction with method 800. The cluster tool 502, as described above, may be utilized where the processing chambers 504 are PVD chambers 300 or CVD chambers 400. In one embodiment, the process chamber is a modified PVD chamber, for example a modified version of the PVD chamber 300 described in FIG. 3 that is equipped to supply dopant precursors, for example dopant precursors supplied from a precursor gas source 332 controlled by a precursor gas flow controller 331.

At operation 801, a substrate intended for coating is disposed on a substrate support in a PVD chamber 300. For example, the optical device substrate 102 is disposed on the substrate support 310.

At operation 802, an optical device material is deposited. The optical device material is deposited from one or more optical device material targets 306 to form an optical device layer over the optical device substrate 102. The optical device material may include one or both of a metal-containing material or a semiconductor material. In one embodiment of operation 802, the process chamber is a PVD chamber, for example the multi-cathode PVD chamber in FIG. 4, and includes an optical device material target cathode 303. The optical device material target cathode 303 is operated at a first power level to deposit the optical device material at a first deposition rate. The optical device material is deposited on a surface of the optical device substrate 102 by setting the optical device material target cathode 303 to a first power level in order to deposit at a first deposition rate to form an optical device layer. For example, the first power level of the optical device material target cathode 303 is in the range of about 0% to about 100%. For example, the first power level of the optical device material target cathode 303 is about 80% and the first deposition rate is about 0.35 nm/s. The PVD chamber 300 may include one or more optical device material targets 306. For example, 3-5 targets selected from at least one of the optical device material targets 306 may be included in the PVD chamber 300. In embodiments with the one or more optical device material targets 306, each optical device material target 306 is operable to deposit a different optical device material.

The optical device layer includes an optical device material at an optical device material concentration. For example, the optical device material concentration is from about 85% to 100% atomic percentage. In one embodiment, the optical device material includes a first refractive index. The first refractive index is greater than 2.0. For example, the first refractive index is between about 2.0 and about 2.8.

At operation 803, a dopant precursor is flowed. The dopant precursor includes dopant material that is flowed in from a precursor gas source 332 corresponding to PVD chamber 300 or from a second gas source 403 corresponding to a CVD chamber 400. The dopant precursor is flowed in to form the doped optical device film 101 on the optical device substrate 102. The dopant precursor includes, but is not limited to, silicon (Si), aluminum (Al), niobium (Nb), titanium (Ti), tantalum (Ta), zirconium (Zr), indium (In), or hafnium (Hf), and oxides, nitrides, or oxynitrides thereof. In one embodiment, which can be combined with other embodiments described herein, the dopant precursor is flowed in such that it is uniformly concentrated in the optical device layer to form one or more zones of a doped optical device film 101. The optical device material is reacted with the dopant precursor to form the doped optical device film 101 on the surface of the optical device substrate 102.

The dopant precursor is flowed in at a second power level in order to deposit the dopant precursor at a flow rate. In one embodiment, which may be combined with other embodiments described herein, the precursor gas flow controller 331 coupled to precursor gas source 332 is set to the second power level. In another embodiment, which may be combined with other embodiments described herein, the second flow controller 418b coupled to the second gas source 403 is set to the first power level. The PVD chamber 300 may include one or more precursor gas sources 332. For example, 3-5 precursor gas sources 332 may be included in the PVD chamber 300. In embodiments with the one or more precursor gas sources 332, each optical device material target 306 is operable to deposit a different optical device material. The CVD chamber 400 may include one or more second gas sources 403. For example, 3-5 second gas sources 403 may be included in the CVD chamber 400. In embodiments with the one or more second gas sources 403, each second gas source 403 is operable to deposit a different dopant precursor.

In one embodiment, which may be combined with other embodiments described herein, the deposition rate of the optical device material is greater than the flow rate of the dopant precursor such that the dopant material has a lower concentration in the doped optical device film 101 than the optical device material. When the second power level is applied, the second power level remains constant throughout operation 803. In one embodiment, which may be combined with other embodiments described herein, the first power level and the second power level may be different. The optical device material provided by the optical device material target 306 and the dopant precursor provided by the precursor gas source 332 or the second gas source 403 have a predetermined concentration, the concentration of the optical device material and dopant material in combination corresponding to the concentration of the doped optical device film 101. In one embodiment, which may be combined with other embodiments described herein, the optical device material includes an optical device material concentration of about 85% to about 100% atomic percentage and the dopant precursor includes a dopant material concentration from about 0% to 15% atomic percentage.

In one embodiment, which may be combined with other embodiments described herein, operations 802 and 803 are repeated by intervals of applying the first power level to the optical device material target cathode 303 and intervals of applying the second power level to the precursor gas flow controller 331 or to the second flow controller 418b. In another embodiment, the flowing the dopant precursor at the second power level is performed by pulsing the second power level at a set frequency while depositing the metal optical device material. In yet another embodiment, which may be combined with other embodiments described herein, the optical device material is deposited and the dopant precursor is flowed concurrently by applying the first power level and the second power level concurrently to form the doped optical device film 101.

In one embodiment, which may be combined with other embodiments described herein, a single performance of operations 802 and 803 form all of the zones of the range of zones 115 of the doped optical device film 101. In another embodiment, a single performance of operations 802 and 803 form a portion of the doped optical device film 101, that portion may correspond to one or more zones of the range of zones 115. Each zone of the range of zones 115 may be every 20 nm to 25 nm of the thickness 110. Operations 802 and 803 are repeated until a predetermined thickness 110 of the doped optical device film 101 is reached.

In one embodiment, which may be combined with other embodiments described herein, operations 802 and 803 can be performed in a PVD chamber 300 with at least an optical device material target 306 and a precursor gas source 332. In another embodiment, which may be combined with other embodiments described herein, operations 801 and 802 can be performed in multiple processing chambers 504 of a cluster tool 502. For example, the optical device substrate 102 is transferred between at least two processing chambers 504. At least one of the processing chambers 504 is a PVD chamber 300 that includes an optical device material target 306 and at least another of the processing chambers 504 is a PVD chamber 300 that includes a precursor gas source 332. In another example, at least one of the processing chambers 504 is a PVD chamber 300 that includes an optical device material target 306 and at least another of the processing chambers 504 is a CVD chamber 400 that includes a second gas source 403.

Figure 9:
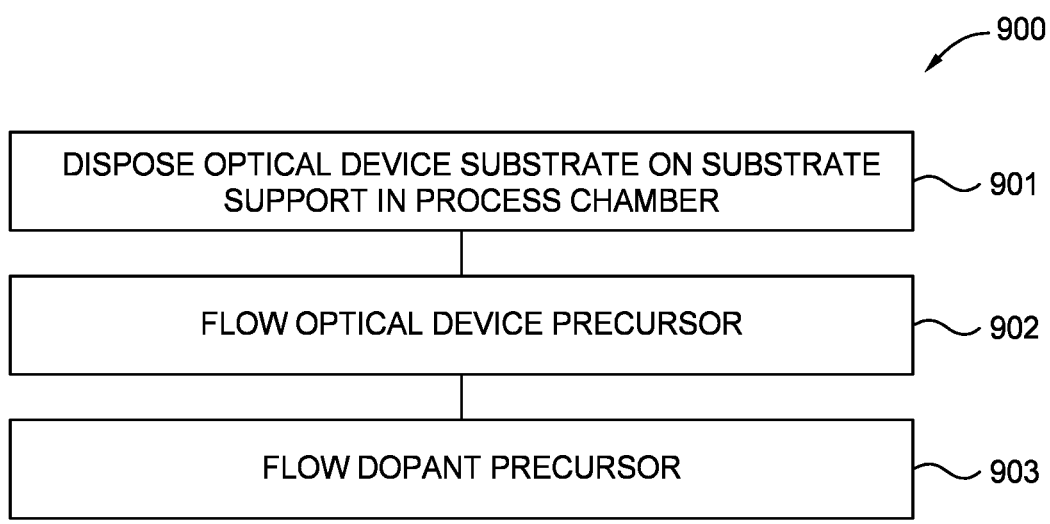
FIG. 9 is a flow diagram of a method for fabricating a doped optical device film according to embodiments.

FIG. 900 is a flow diagram of an exemplary method 900 for fabricating a doped optical device film 101. To facilitate explanation, FIG. 9 will be described with reference to the CVD chamber 400 of FIG. 4 and the cluster tool 502 of FIG. 5. However, it is to be noted that a CVD chamber other than the CVD chamber 400 of FIG. 4 may be utilized in conjunction with method 900. It is also to be noted that a cluster tool other than the cluster tool 502 of FIG. 5 may be utilized in conjunction with method 700. The cluster tool 502, as described above, may be utilized where the processing chambers 504 are CVD chambers 400.

At operation 901, a substrate intended for coating is disposed on a substrate support in a CVD chamber 400. For example, the optical device substrate 102 is disposed on the substrate support 410.

At operation 902, an optical device material precursor is flowed. The optical device material precursor contains an optical device material that is flowed in from a first gas source 402 to form an optical device layer over the optical device substrate 102. The optical device material may include one or both of a metal-containing material or a semiconductor material. The metal-containing precursor includes, but is not limited to metals, metal oxides, metal nitrides or metal oxy-nitrides such as titanium dioxide ($TiO_2$), tantalum pentoxide ($Ta_2O_5$), zirconium dioxide ($ZrO_2$), indium oxide ($In_2O_3$), or hafnium oxide ($HfO_2$). The semiconductor precursor includes, but is not limited to, silicon (Si), germanium (Ge), silicon germanium (SiGe), III-V semiconductors, II-IV semiconductors, ternary semiconductors, quaternary semiconductors, transparent conducting oxides, or combinations thereof. In other embodiments, the semiconductor precursor is an oxide, oxynitride, nitride, or carbide of Si, Ge, SiGe, a III-V semiconductor, a II-IV semiconductor, a ternary semiconductor, a quaternary semiconductor, or a transparent conducting oxide.

In embodiments when the optical device material is a metal, the optical device layer is formed when the flowed in metal of the first gas source 402 reacts with a reactive gas to form the optical device layer over the optical device substrate 102. In embodiments when the optical device material is a metal oxide, metal nitride, or metal oxy-nitride, the optical device layer is formed when the optical device material is flowed in over the optical device substrate 102. The first flow controller 418a coupled to the first gas source 402 is set to a first power level in order to flow in the optical device material precursor at a flow rate. When the first power level is applied, the first power level remains constant throughout operations 902 and 903. The CVD chamber 400 may include one or more first gas sources 402. For example, 3-5 first gas sources 402 may be included in the chamber 300. Each first gas source 402 is operable to deposit a different optical device material. The CVD chamber 400 may include one or more first gas sources 403. For example, 3-5 first gas sources 402 may be included in the CVD chamber 400. In embodiments with the one or more first gas sources 402, each first gas source 402 is operable to deposit a different dopant precursor.

At operation 903, a dopant precursor is flowed. The dopant precursor includes a dopant material that is flowed in from second gas source 403. The dopant precursor is flowed in to form the doped optical device film 101 on the optical device substrate 102. The dopant precursor includes, but is not limited to, silicon (Si), aluminum (Al), niobium (Nb), titanium (Ti), tantalum (Ta), zirconium (Zr), indium (In), or hafnium (Hf), and oxides, nitrides, or oxynitrides thereof. In one embodiment, which can be combined with other embodiments described herein, the dopant precursor is flowed in such that it is uniformly concentrated in the optical device layer to form one or more zones of a doped optical device film 101. In embodiments when the optical device material precursor is a titanium precursor and the dopant precursor is oxygen ($O_2$), the metal-containing precursor reacts with the precursor to form titanium dioxide ($TiO_2$).

The dopant precursor is flowed in at a second power level in order to deposit the dopant material at a flow rate. In one embodiment, which may be combined with other embodiments described herein, a second flow controller 418b coupled to the second gas source 403 is set to the second power level. In one embodiment, which may be combined with other embodiments described herein, the flow rate of the optical device material precursor is greater than the flow rate of the dopant precursor such that the dopant material has a lower concentration in the doped optical device film 101 than the optical device material. When the second power level is applied, the second power level remains constant throughout operation 903. In one embodiment, which may be combined with other embodiments described herein, the first power level and the second power level may be different. The optical device material precursor provided by the first gas source 402 and the dopant precursor provided by the second gas source 403 have a predetermined concentration, the concentration of the optical device material and dopant material in combination corresponding to the concentration of the doped optical device film 101. In one embodiment, which may be combined with other embodiments described herein, the optical device material precursor includes an optical device material concentration of about 85% to about 100% atomic percentage and the dopant precursor includes a dopant material concentration from about 0% to 15% atomic percentage. The CVD chamber 400 may include one or more second gas sources 403. For example, 3-5 second gas sources 403 may be included in the chamber 300. Each second gas source 403 is operable to deposit a different dopant precursor.

In one embodiment, which may be combined with other embodiments described herein, operations 902 and 903 are repeated by intervals of applying the first power level to the first flow controller 418a and intervals of applying the second power level to the second flow controller 418b. In another embodiment, the flowing the dopant precursor at the second power level is performed by pulsing the second power level at a set frequency while flowing in the optical device material precursor. In yet another embodiment, which may be combined with other embodiments described herein, the optical device material precursor and the dopant precursor are flowed concurrently by applying the first power level and the second power level concurrently to form the doped optical device film 101.

In one embodiment, which may be combined with other embodiments described herein, a single performance of operations 902 and 903 forms all of the zones of the range of zones 115 of the doped optical device film 101. In another embodiment, a single performance of operations 902 and 903 forms a portion of the doped optical device film 101, that portion may correspond to one or more zones of the range of zones 115. Operations 902 and 903 are repeated until a predetermined thickness 110 of the doped optical device film 101 is reached. In one embodiment, which may be combined with other embodiments described herein, operations 902 and 903 can be performed in a CVD chamber 400 with at least a first and second gas source 402, 403. In another embodiment, which may be combined with other embodiments described herein, operations 902 and 903 can be performed in multiple processing chambers 504 of a cluster tool 502. For example, the optical device substrate 102 is transferred between at least two processing chambers 504. At least one of the processing chambers 504 is a CVD chamber 400 that includes an optical device material target and at least another of the processing chambers 504 is a CVD chamber 400 that includes a second gas source 403.

In one embodiment, the doped optical device film 101 of methods 600-900 is maintained at a temperature within a range that enables the doped optical device film 101 to remain amorphous. In the embodiment, which may be combined with other embodiments described herein, the doped optical device film 101 is maintained in this temperature range throughout methods 600-900. In one embodiment, the optical device substrate 102 is maintained at a temperature greater than about 30° C., such as between about 30° C. to 300° C. In one embodiment, the temperature is maintained by using the cooling conduit 318, 414 to cool the substrate support 310, 410 and the optical device substrate 102. For example, a cooling fluid is flowed through the cooling conduit 318 disposed in the substrate support 310. In one embodiment, the temperature is maintained by using the heater 322 or heating conduit 414 to heat the substrate support 310, 410 and the optical device substrate 102.

In the methods 600-900, the optical device material is exposed to processing temperatures of about 30° C. or greater. The dopant material incorporated into the optical device layer enables the doped optical device film 101 to form amorphously at temperatures greater than about 30° C., such as between about 100° C. and about 300° C. The optical device material with the dopant material forms amorphously when the dopant material is incorporated into the optical device layer, where the dopant material modifies the composition of the optical device material and interrupts the formation of crystalline structures in the optical device layer that would otherwise form above a certain temperature specific to the optical device material. For example, titanium dioxide ($TiO_2$), may form polycrystalline titanium dioxide ($TiO_2$) at temperatures at or between 30° C. to 200° C. and may form pronounced crystals at temperatures at or above 200° C.

In summation, improved methods and materials to form doped optical device films 101 with optical properties, including a uniform high refractive index and low absorption loss are described herein. To achieve desirable optical properties, the dopant material is distributed at a dopant concentration in the optical device layer and the doped optical device film is maintained within a temperature process window that enables the doped optical device film to form amorphously (i.e., without the formation of crystalline structures). The dopant material at a dopant concentration expands the temperature process window of the doped optical device film. The dopant material modifies the composition of the optical device layer such that crystal formation is interrupted at a given temperature. For example, where the optical device layer has the dopant material uniformly distributed throughout, crystal formation is disrupted at a temperature between about 30° C. to 300° C. A 0-50% concentration of dopant atoms of the dopant material affects the morphology of the doped optical device film without a significant detrimental increase in the refractive index of the optical device layer.

While the foregoing is directed to embodiments of the present disclosure, other and further embodiments of the disclosure may be devised without departing from the basic scope thereof, and the scope thereof is determined by the claims that follow.

What is claimed is:

1. A method for forming a film, comprising:
    disposing an optical device substrate on a substrate support, the substrate support disposed in a chamber, the chamber comprising:
    an optical device material target disposed in the chamber, the optical device material target comprising an optical device material, wherein the optical device material comprises one or both of:
        a metal-containing material that comprises tantalum pentoxide ($Ta_2O_5$), zirconium dioxide ($ZrO2$), indium oxide ($In2O3$), or hafnium oxide ($HfO2$); and
        a semiconductor material that comprises silicon (Si), germanium (Ge), silicon germanium (SiGe), III-V semiconductors, II-IV semiconductors, ternary semiconductors, quaternary semiconductors, and transparent conducting oxides; and
    a dielectric target disposed in the chamber, the dielectric target comprising a dopant material, wherein the dopant material comprises:
        silicon (Si), niobium (Nb), titanium (Ti), tantalum (Ta), zirconium (Zr), indium (In), hafnium (Hf), or oxides thereof, the dopant material and the optical device material are different; and
    depositing an amorphous doped optical device film on the optical device substrate, comprising:
    depositing the optical device material to form an optical device layer on a surface of the optical device substrate, the depositing the optical device material comprising providing a first power level of a DC power source to the optical device material target to deposit the optical device material at a first deposition rate; and
    depositing the dopant material into the optical device layer to form the amorphous doped optical device film, the depositing the dopant material comprising providing a second power level of a RF power source to the dielectric target to deposit the dopant material at a second deposition rate, wherein the first deposition rate and the second deposition rate are different.

2. The method of claim 1, further comprising maintaining the optical device substrate at a temperature greater than about 30° C. during the depositing the optical device material and the depositing the dopant material.

3. The method of claim 1, further comprising oxidizing the surface of the optical device substrate.

4. The method of claim 1, wherein the depositing the optical device material and the depositing the dopant material are performed sequentially.

5. The method of claim 1, wherein the depositing the dopant material at the second power level is performed by pulsing the second power level at a set frequency while depositing the optical device material.

6. The method of claim 1, wherein the doped optical device film comprises the dopant material at a dopant concentration of 0% to 15% atomic percentage.

7. A method for forming a film, comprising:
    disposing an optical device substrate in a chamber, the chamber comprising one or more targets each having a pre-doped optical device material, the pre-doped optical device material comprising:
        an optical device material at a first concentration; and
        a dopant material at a second concentration; and
    providing power to the target to deposit an amorphous doped optical device film on the optical device substrate, wherein the optical device substrate is maintained at a temperature greater than about 30° C. during the depositing the amorphous doped optical device film.

8. The method of claim 7, wherein the optical device material includes one or both of:

a metal-containing material that comprises titanium dioxide (TiO$_2$), tantalum pentoxide (Ta$_2$O$_5$), zirconium dioxide (ZrO$_2$), indium oxide (In$_2$O$_3$), or hafnium oxide (HfO$_2$); and a semiconductor material that comprises silicon (Si), germanium (Ge), silicon germanium (SiGe), III-V semiconductors, II-IV semiconductors, ternary semiconductors, quaternary semiconductors, and transparent conducting oxides.

9. A method for forming a film, comprising:

disposing an optical device substrate in a chamber;

flowing an optical device material precursor into the chamber at a first flow rate to deposit an optical device layer on a surface of the optical device substrate; and flowing a dopant precursor into the chamber at a second flow rate to form an amorphous doped optical device film on the optical device substrate, and wherein the optical device substrate is maintained at a temperature greater than about 30° C. during the deposition of the optical device layer and the flowing of the dopant precursor.

10. The method of claim 9, wherein the flowing the optical device material precursor into the chamber comprises introducing an oxygen-containing precursor into the chamber.

11. The method of claim 10, wherein the optical device material precursor is a titanium precursor.

12. The method of claim 9, wherein the dopant precursor is silane (SiH$_4$).

13. The method of claim 9, wherein the dopant precursor is deposited in the doped optical device film at a concentration of 0% to 15% atomic percentage.

14. A method for forming a film, comprising:

disposing an optical device substrate on a substrate support, the substrate support disposed in a chamber, the chamber comprising:

an optical device material target disposed in the chamber, the optical device material target comprising an optical device material, wherein the optical device material comprises one or both of:

a metal-containing material that comprises tantalum pentoxide (Ta2O5), zirconium dioxide (ZrO2), indium oxide (In2O3), or hafnium oxide (HfO2); and a semiconductor material that comprises silicon (Si), germanium (Ge), silicon germanium (SiGe), III-V semiconductors, II-IV semiconductors, ternary semiconductors, quaternary semiconductors, and transparent conducting oxides; and a dielectric target disposed in the chamber, the dielectric target comprising a dopant material, wherein the dopant material comprises:

silicon (Si), niobium (Nb), titanium (Ti), tantalum (Ta), zirconium (Zr), indium (In), hafnium (Hf), or oxides thereof, the dopant material and the optical device material are different;

depositing an amorphous doped optical device film on the optical device substrate, comprising:

depositing the optical device material to form an optical device layer on a surface of the optical device substrate, the depositing the optical device material comprising providing a first power level to the optical device material target and providing an oxygen-containing gas to the chamber to deposit the optical device layer at a first deposition rate; and depositing the dopant material into the optical device layer to form the doped optical device film, the depositing the dopant material comprising providing a second power level to the dielectric target to deposit the dopant material at a second deposition rate, wherein the first deposition rate and the second deposition rate are different.

15. An optical device, comprising:

an amorphous doped optical device film disposed over a surface of an optical device substrate, the doped optical device film comprising:

an amorphous optical device material, wherein the amorphous optical device material comprises one or both of:

a metal-containing material that comprises tantalum pentoxide (Ta2O5), zirconium dioxide (ZrO2), indium oxide (In2O3), or hafnium oxide (HfO2); and a semiconductor material that comprises silicon (Si), germanium (Ge), silicon germanium (SiGe), III-V semiconductors, II-IV semiconductors, ternary semiconductors, quaternary semiconductors, and transparent conducting oxides; and a dopant material, wherein the dopant material is incorporated into the amorphous optical device material, the dopant material comprising:

silicon (Si), niobium (Nb), titanium (Ti), tantalum (Ta), zirconium (Zr), indium (In), hafnium (Hf), or oxides thereof, the dopant material and the amorphous optical device material are different.

16. The optical device of claim 15, wherein:

the amorphous optical device material has a first refractive index; and the dopant material has a second refractive index, wherein the first refractive index is greater than the second refractive index.

17. The optical device of claim 15, wherein the dopant material has a concentration of 0% to 15% atomic percentage in the doped optical device film.

* * * * *